(12) United States Patent
Lu et al.

(10) Patent No.: US 7,434,308 B2
(45) Date of Patent: Oct. 14, 2008

(54) COOLING OF SUBSTRATE USING INTERPOSER CHANNELS

(75) Inventors: Minhua Lu, Mohegan Lake, NY (US); Lawrence S. Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 707 days.

(21) Appl. No.: 10/933,051

(22) Filed: Sep. 2, 2004

(65) Prior Publication Data
US 2006/0042825 A1    Mar. 2, 2006

(51) Int. Cl.
H05K 3/36    (2006.01)
(52) U.S. Cl. .................................. 29/830; 174/252
(58) Field of Classification Search .............. 29/852, 29/832, 830; 174/252; 257/678
See application file for complete search history.

(56) References Cited

U.S. PATENT DOCUMENTS 4,921,041 A    5/1990    Akachi
5,219,020 A    6/1993    Akachi
5,490,558 A    2/1996    Akachi
5,697,428 A    12/1997    Akachi

*Primary Examiner*—Dean A. Reichard
*Assistant Examiner*—Abiy Getachew
(74) *Attorney, Agent, or Firm*—Schmeiser, Olsen & Watts; Robert M. Trepp

(57) ABSTRACT

A structure, and method of forming and cooling the structure. The structure may include a substrate (e.g., a semiconductor chip) having N continuous substrate channels and an interposer having N continuous interposer channels ($N \geq 2$). The N interposer channels are coupled to the N substrate channels to form M continuous loops ($1 \leq M \leq N$). The M loops may transfer heat from a heat source within the substrate to the interposer and then to a heat sink thermally coupled to the interposer. The structure may include an interposer having a thermally conductive enclosure surrounding a cavity. The cavity contains a thermally conductive foam material (e.g., graphite foam). The foam material contains a serpentine channel having contiguously connected channel segments. The serpentine channel may transfer heat from a heat source within a substrate (e.g., a semiconductor chip) to the interposer and then to a heat sink thermally coupled to the interposer.

17 Claims, 13 Drawing Sheets

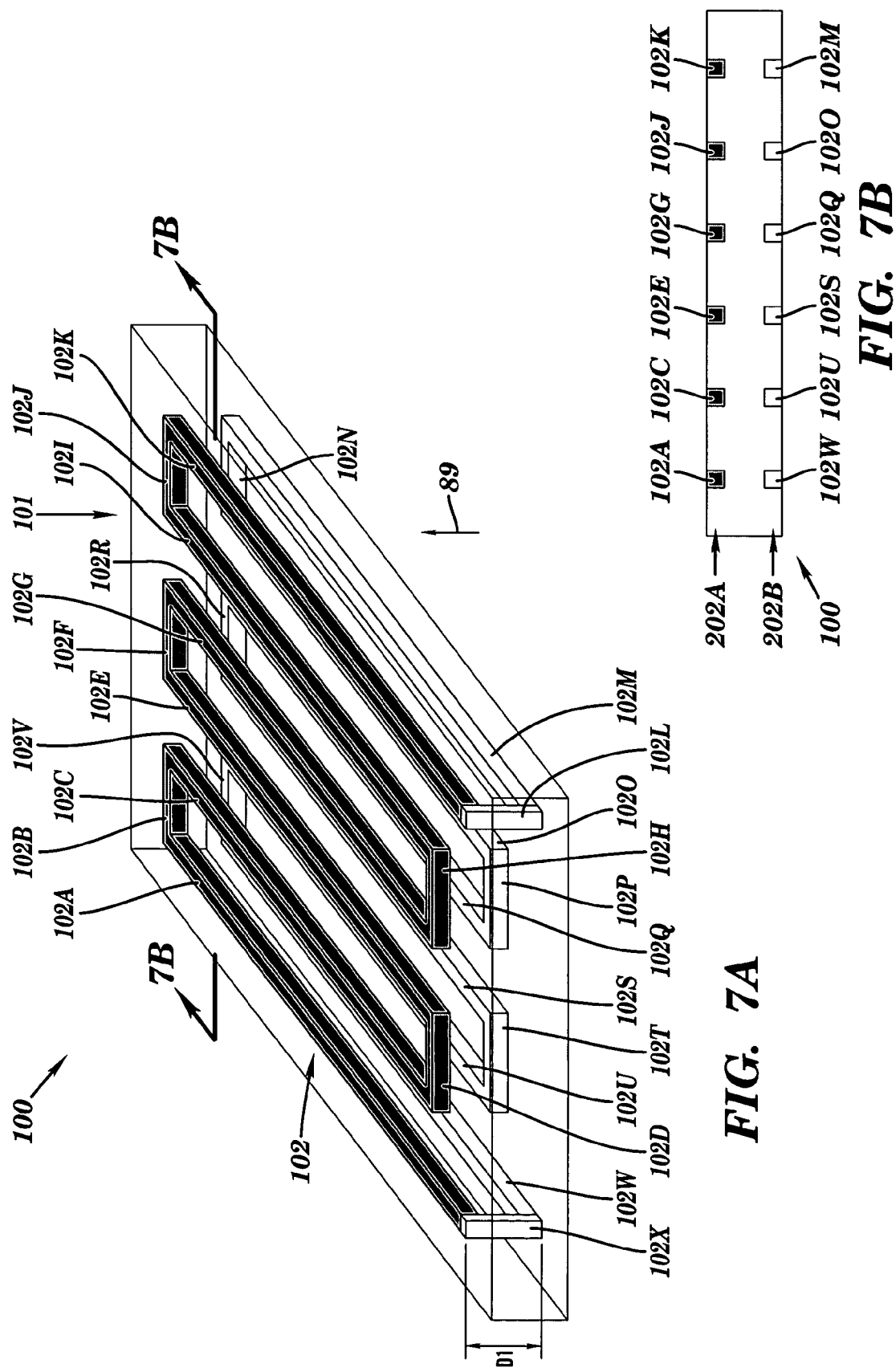

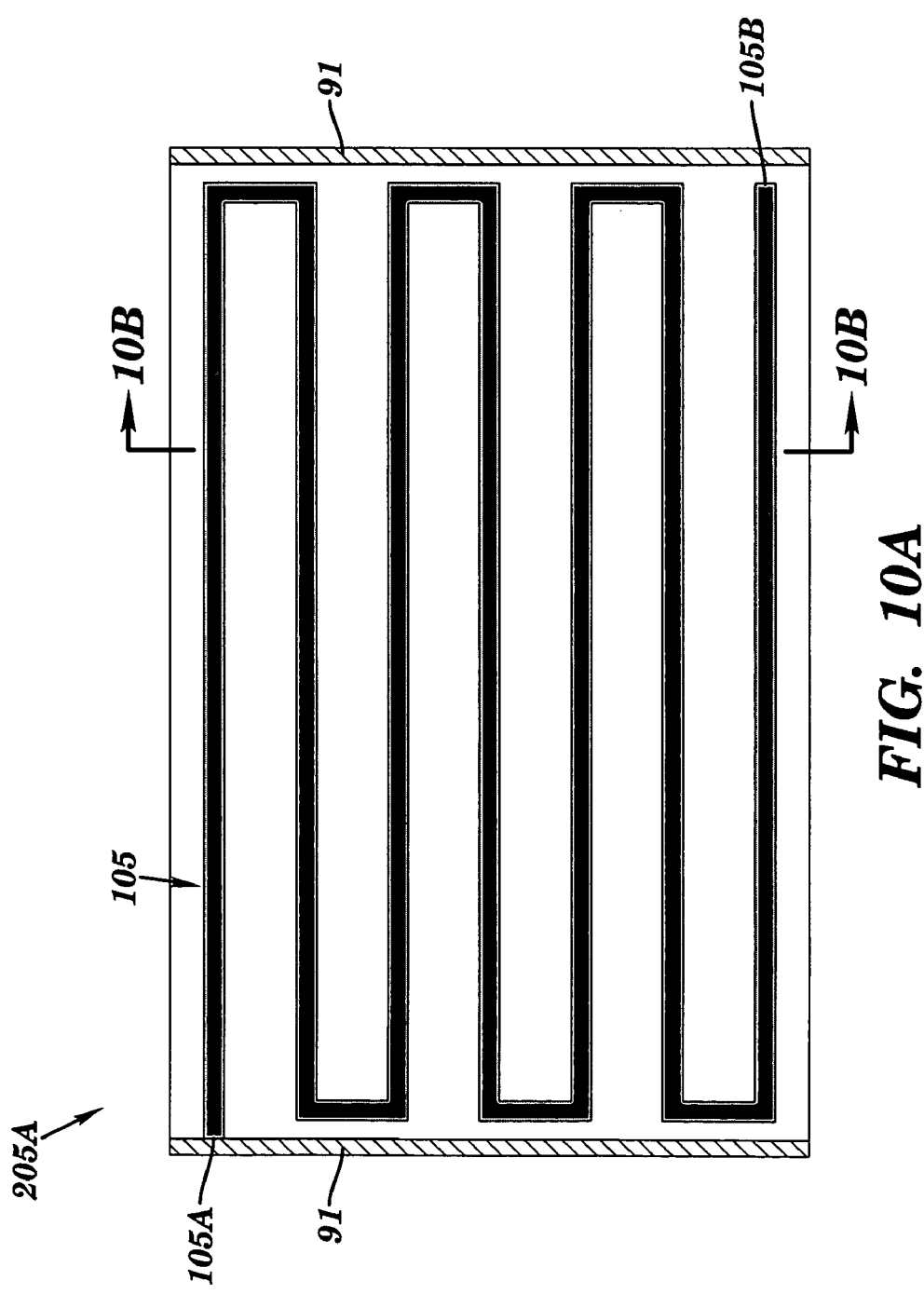

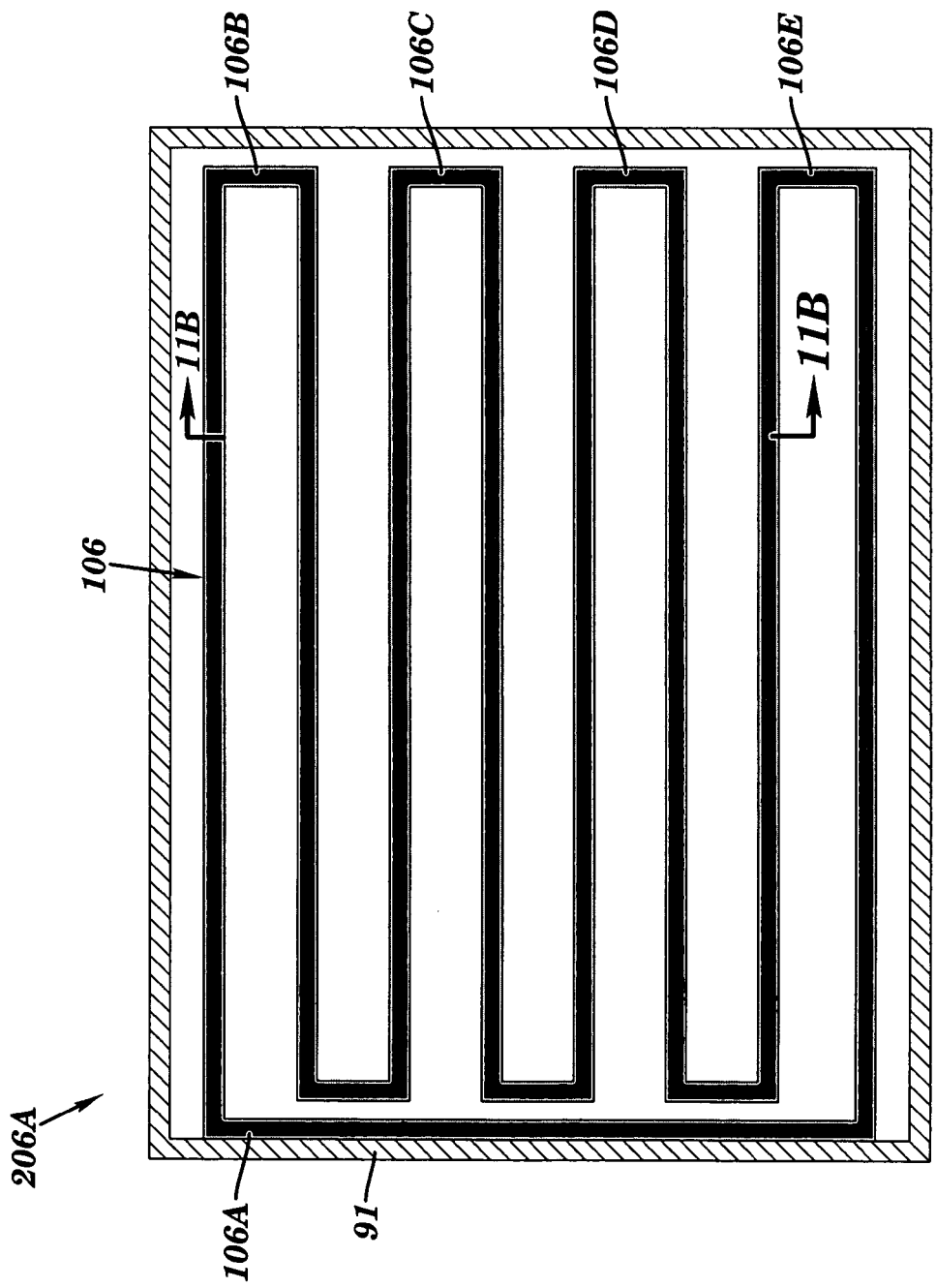

COOLING OF SUBSTRATE USING INTERPOSER CHANNELS

BACKGROUND OF THE INVENTION

1. Technical Field

The present invention relates generally to cooling a substrate, and more specifically to cooling a semiconductor chip.

2. Related Art

Thermal management is relevant to the operation of semiconductors devices. The power density in semiconductor devices continues to increase as the circuit density and operating frequency increase. Thermal management includes dissipating the heat generated by a semiconductor device away from the device and allowing the generated heat to disperse to its surroundings, while maintaining the semiconductor device at as low a temperature as possible. Insufficient transfer of heat away from a semiconductor device can result in performance and reliability degradation of the semiconductor device due to an unacceptably high operating temperature.

High performance semiconductor chips may have one or more "hot-spots", which are regions of the chip having a power density that is substantially greater than the average power density (e.g., two to three times the average power density). To insure reliable long term operation, the thermal management of a semiconductor chip should account for these hot spots as well as for the average power density of the semiconductor chip.

Unfortunately, current methods of dissipating heat from a semiconductor chip are far from optimal. Thus, there is a need for a more efficient cooling of a semiconductor chip than exists in the related art.

SUMMARY OF THE INVENTION

The present invention provides a structure, comprising:

a substrate comprising N continuous substrate channels on a first side of the substrate, said substrate having a heat source therein, said N being at least 2; and an interposer comprising N continuous interposer channels, said N interposer channels being coupled to the N substrate channels so as to form M continuous loops such that $1 \leq M \leq N$, each loop of the M loops independently consisting of K substrate channels of the N substrate channels and K interposer channels of the N interposer channels in an alternating sequence of substrate channels and interposer channels, for each loop of the M loops said K is at least 1 and is subject to an upper limit consistent with a constraint of having the M loops collectively consist of the N interposer channels and the N substrate channels, each loop of the M loops independently being open ended or closed, said first side of the substrate being connected to the interposer, said interposer adapted to be thermally coupled to a heat sink such that the interposer is interposed between the substrate and the heat sink.

The present invention provides a method of cooling a substrate, comprising:

providing a substrate comprising N continuous substrate channels on a first side of the substrate, said substrate having a heat source therein, said N being at least 2;

providing an interposer comprising N continuous interposer channels, said N interposer channels being coupled to the N substrate channels so as to form M continuous loops such that $1 \leq M \leq N$, each loop of the M loops independently consisting of K substrate channels of the N substrate channels and K interposer channels of the N interposer channels in an alternating sequence of substrate channels and interposer channels, for each loop of the M loops said K is at least 1 and is subject to an upper limit consistent with a constraint of having the M loops collectively consist of the N interposer channels and the N substrate channels, each loop of the M loops independently being open ended or closed, said first side of the substrate being connected to the interposer, said interposer being thermally coupled to a heat sink such that the interposer is interposed between the substrate and the heat sink.

generating heat by the heat source; and circulating fluid in the N substrate channels and the N substrate channels, wherein a portion of the heat generated by the heat source is transferred to the fluid in the N substrate channels, and wherein a percentage of the portion of the heat is transferred from the fluid in the M interposer channels to the heat sink.

The present invention provides a method of forming a structure, comprising:

providing a substrate comprising N continuous substrate channels on a first side of the substrate, said substrate having a heat source therein, said N being at least 2; and providing an interposer comprising N continuous interposer channels, said N interposer channels being coupled to the N substrate channels so as to form M continuous loops such that $1 \leq M \leq N$, each loop of the M loops independently consisting of K substrate channels of the N substrate channels and K interposer channels of the N interposer channels in an alternating sequence of substrate channels and interposer channels, for each loop of the M loops said K is at least 1 and is subject to an upper limit consistent with a constraint of having the M loops collectively consist of the N interposer channels and the N substrate channels, each loop of the M loops independently being open ended or closed, said first side of the substrate being connected to the interposer, said interposer adapted to be thermally coupled to a heat sink such that the interposer is interposed between the substrate and the heat sink The present invention provides a structure, comprising an interposer adapted to be interposed between a heat source and a heat sink and to transfer heat from the heat source to the heat sink, said interposer comprising an enclosure that encloses a cavity, said enclosure being made of a thermally conductive material, said cavity comprising a thermally conductive foam material therein, said foam material comprising pores and comprising at least one serpentine channel, each serpentine channel having a plurality of contiguously connected channel segments, each serpentine channel independently forming a closed loop or an open ended loop, said foam material adapted to be soaked by a liquid filling said pores, each serpentine channel being adapted to be partially filled with a fluid that serves to transfer heat from the heat source to the heat sink.

The present invention provides a method of cooling a substrate, comprising:

providing a substrate comprising heat source, a heat sink, and an interposer, said interposer being interposed between the heat sink and the heat source, said interposer comprising an enclosure that encloses a cavity, said enclosure being made of a thermally conductive material, said cavity comprising a thermally conductive foam material therein, said foam material comprising pores and comprising at least one serpentine channel, each serpentine channel having a plurality of contiguously connected channel segments, each serpentine channel independently forming a closed loop or an open ended loop, said foam being soaked by a liquid filling said pores;

generating heat by the heat source; and providing a fluid in each serpentine channel, wherein a portion of the heat generated by the heat source is transferred to the fluid, and wherein a percentage of the portion of the heat is transferred from the fluid to the heat sink.

The present invention provides a method of forming a structure, comprising providing an interposer adapted to be interposed between a heat source and a heat sink and to transfer heat from the heat source to the heat sink, said interposer comprising an enclosure that encloses a cavity, said enclosure being made of a thermally conductive material, said cavity comprising a thermally conductive foam material therein, said foam material comprising pores and comprising at least one serpentine channel, each serpentine channel having a plurality of contiguously connected channel segments, each serpentine channel independently forming a closed loop or an open ended loop, said foam material adapted to be soaked by a liquid filling said pores, each serpentine channel being adapted to be partially filled with a fluid that serves to transfer heat from the heat source to the heat sink.

The present invention advantageously provides a more efficient cooling of a semiconductor chip than exists in the related art.

BRIEF DESCRIPTION OF THE DRAWINGS

FIGS. 6-12 depict illustrative embodiments of serpentine channels within the interposer of FIG. 5.

DETAILED DESCRIPTION OF THE INVENTION

Figure 1:
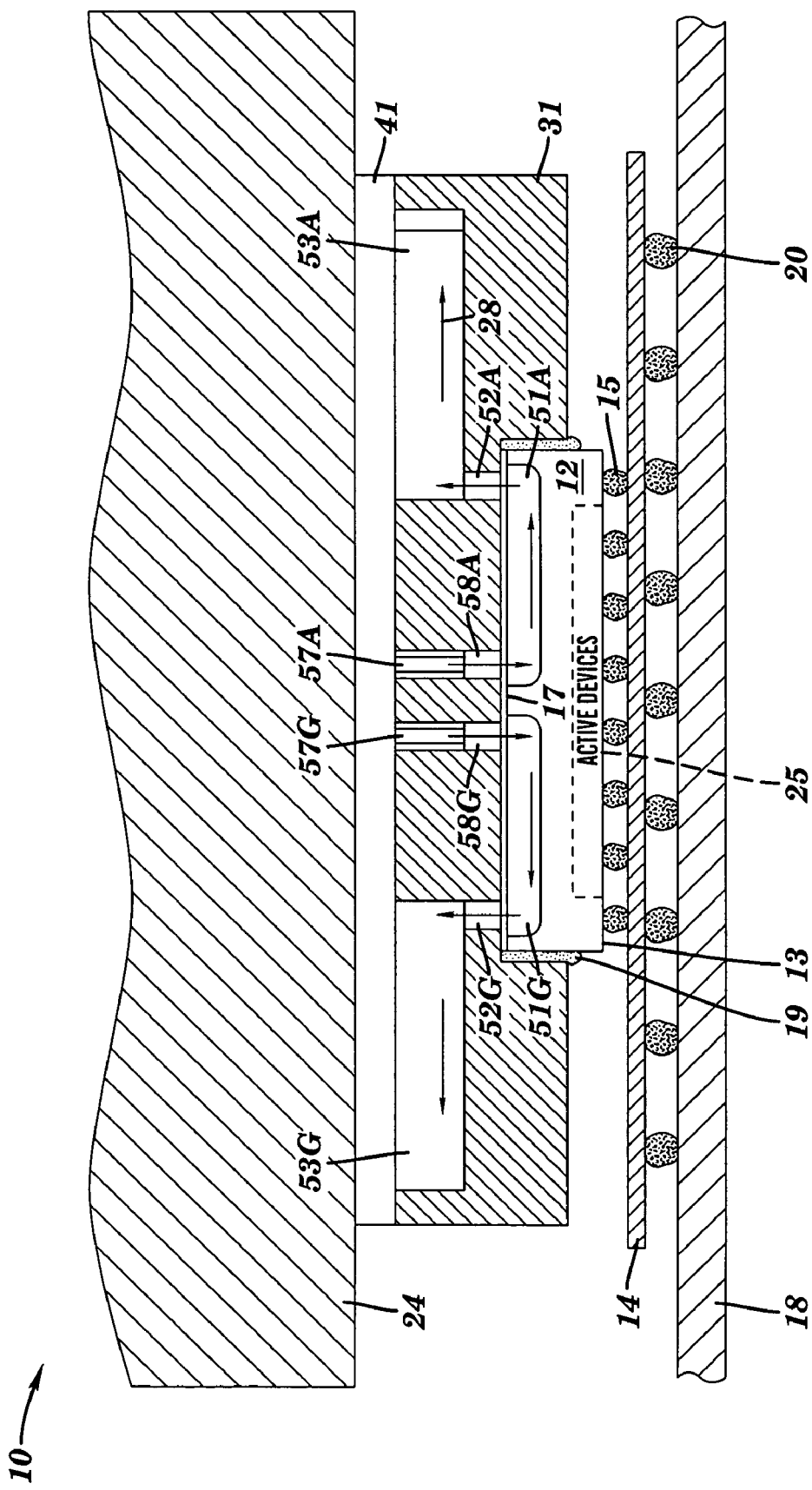
FIG. 1 depicts a front cross-sectional view of a structure comprising a semiconductor chip and an interposer coupled to the semiconductor chip, in accordance with first embodiments of the present invention.

FIG. 1 illustrates a front cross-sectional view of a structure 10 comprising a semiconductor chip 12 and a interposer 31 coupled to the semiconductor chip 12, in accordance with first embodiments of the present invention. The semiconductor chip 12 comprises a semiconductor material (e.g., silicon, germanium, etc.). The semiconductor chip 12 may be underfilled with a polymer (not shown) for improved reliability.

The semiconductor chip 12 is placed in a recess in the interposer 31 with a sealant 19 placed around the semiconductor chip 12. The sealant 19, which may be thermally conductive or thermally insulative, mechanically and thermally couples the semiconductor chip 12 to the interposer 31.

Although FIG. 1 shows the semiconductor chip 12 as being partially but not totally embedded within the interposer 31, the semiconductor chip 12 may alternatively be totally embedded within the interposer 31

The semiconductor chip 12 comprises a front surface 13 and an opposing back surface 17. Active electronic devices (e.g., transistors) within the semiconductor chip 12 generate heat during operation of the semiconductor chip 12. The active electronic devices may be located in a region 25 of the semiconductor chip 12, wherein the region 25 is on the front side of the semiconductor chip 12 bounded by the front surface 13. This generated heat is to be dissipated sufficiently fast so as to maintain the active electronic devices at an acceptable temperature that does not damage the semiconductor chip 12, does not adversely impact electrical performance of the semiconductor chip 12, and does not excessively limit the endurance (e.g., mean time to failure) of the semiconductor chip 12 or of components (e.g., an active electronic device or another device) therein.

The operating semiconductor chip 12 is cooled by a heat transfer mechanism in which the heat generated by the semiconductor chip 12 is transferred to the interposer 31 via fluid flow in one or more loops. Each such loop comprises channels within the semiconductor chip 12 (e.g., channel 51A, etc. interfacing the back surface 17 of the semiconductor chip 12) and channels within the interposer 31 (e.g., channels 52A, 53A, . . . , 57A, 58A). The arrows (e.g., arrow 28) in FIG. 1 point in a direction of fluid flow. The details of this heat transfer mechanism will be described infra in conjunction with FIGS. 2A, 2B, 3, 4A, and 4B.

A cover 41, which is thermally conductive and covers the interposer 31, thermally couples the interposer 31 to a heat sink 24. Heat is transferred from the interposer 31 to the heat sink 24 via the cover 41. Heat is transferred from the heat sink 24 to the surrounding ambient environment (e.g., atmospheric air). The heat sink may be any type of heat sink known to a person of ordinary skill in the art having any geometry (e.g., fins) that is suitable for transferring heat to the surrounding ambient environment.

A coefficient of thermal expansion (CTE) of the interposer 31 and/or cover 41 may be substantially equal to a CTE of the semiconductor chip 12. The CTE of the interposer 31 and/or cover 41 is substantially equal to the CTE of the semiconductor chip 12 if said CTEs are sufficiently matched so as to substantially prevent or mitigate thermal stresses in the semiconductor chip 12 as the semiconductor chip 12 heats up or cools down. Thus, the interposer 31 and the cover 41 independently comprise a thermally conductive material such as, inter alia, silicon-carbide, aluminum-silicon alloy, diamonds, other copper alloys thereof, etc. The preceding thermally conductive materials (i.e., silicon-carbide, aluminum-silicon alloy, diamonds, other copper alloys thereof, etc.) may have a CTE that is substantially equal to a CTE of a semiconductor chip 12 that comprises silicon.

The front surface 13 of the semiconductor chip 12 is electrically connected to a chip carrier 14 using micro solder balls 15 (e.g., Controlled Collapse Chip Connection solder balls). The chip carrier 14 may be an organic chip carrier, a ceramic chip carrier, a silicon chip carrier, etc. The packaged chip comprising the chip carrier 14, the semiconductor chip 12, the interposer 31, and the heat sink 24 is mounted onto an electronic carrier 18 (e.g., a circuit board) using larger solder balls 20 (e.g., a Ball Grid Array solder balls).

Figure 2A:
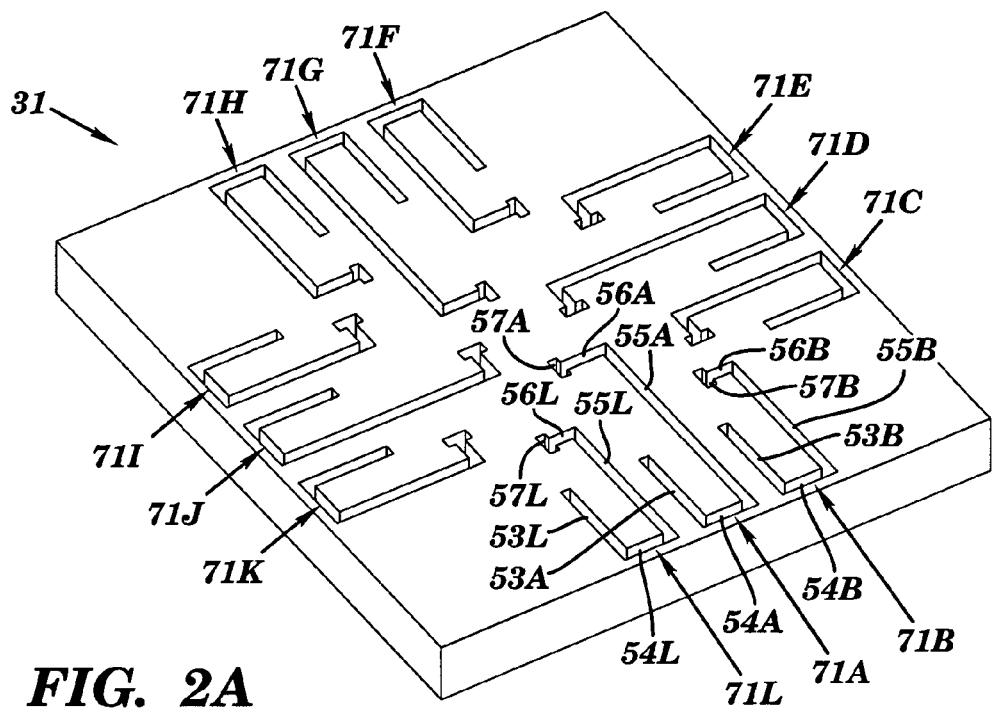
FIGS. 2A and 2B depict a top view of the interposer and semiconductor chip, respectively, of FIG. 1.
Figure 2B:
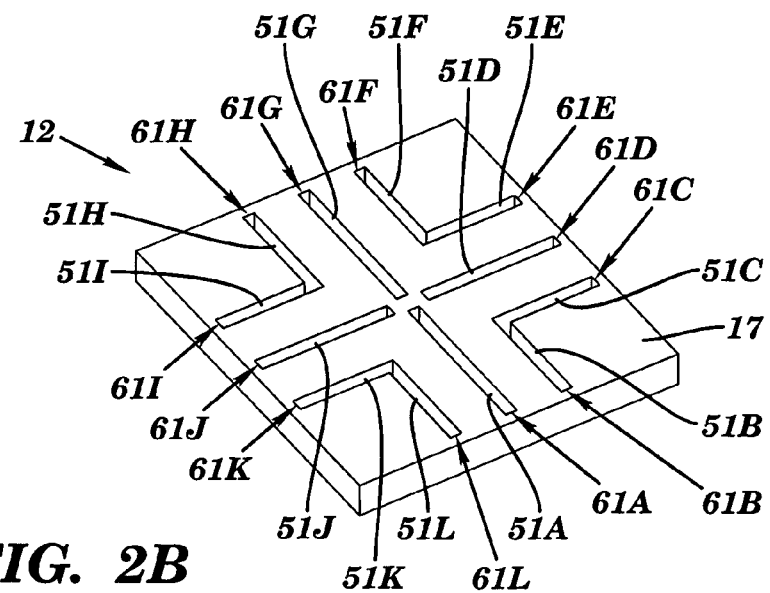

FIGS. 2A and 2B depict a top view of the interposer 31 and semiconductor chip 12, respectively, of FIG. 1.

Figure 3A:
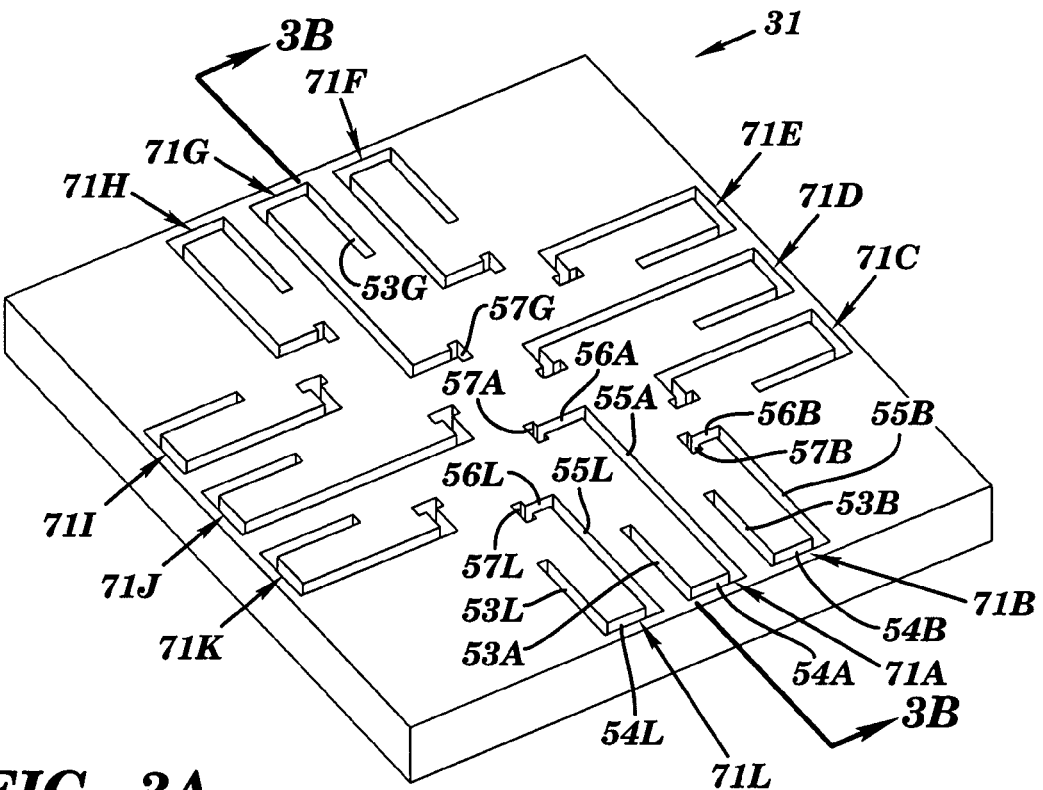
FIG. 3A is a top view of the interposer of FIG. 2A showing a cut plane that defines a cross sectional view of the interposer and the semiconductor chip coupled thereto.

FIG. 2A depicts 12 continuous interposer channels identified as interposer channels 71A, 71B, 71C, 71D, 71E, 71F, 71G, 71H, 71I, 71J, 71K, and 71L. Each continuous interposer channel shown in FIG. 2A comprises a plurality of contiguous channel segments. The interposer channel 71A comprises channel segments 52A, 53A, 54A, 55A, 56A, 57A, and 58A, wherein channel segments 52A, 57A, and 58A are not shown in FIG. 2A but are shown in FIGS. 1 and 3A. The interposer channel 71B comprises channel segments 52B, 53B, 54B, 55B, 56B, 57B, and 58B, wherein channel segments 52B, 57B, and 58B are not shown in FIG. 2A but are shown in FIGS. 1 and 3A. The interposer channel 71L comprises channel segments 52L, 53L, 54L, 55L, 56L, 57L, and 58L, wherein channel segments 52L, 57L, and 58L are not shown in FIG. 2A but are shown in FIGS. 1 and 3A. Channels 71C, 71D, 71E, 71F, 71G, 71H, 71I, 71J, and 71K each similarly comprise a plurality of channel segments.

For each interposer channel, the channel segments in each pair of adjacent channel segments form a non-zero angle at the location where the two channel segments are joined. For example, the channel segments 55A and 56A form an angle of about 90 degrees at the location 59 where the channel segments 55A and 56A are joined.

As seen in FIGS. 1 and 2A, the interposer channel 71A comprises a first channel segment (e.g., channel segment 52A) and a second channel segment (e.g., channel segment 53A), wherein the first channel segment is about perpendicular to the second channel segment.

FIG. 2B depicts 12 continuous semiconductor chip channels (hereinafter, "chip channels") 61A, 61B, 61C, 61D, 61E, 61F, 61G, 61H, 61I, 61J, 61K, and 61L, which are formed on the surface 17 of the semiconductor chip 12 (e.g., by etching). The chip channel 61A comprises channel segment 51A, the chip channel 61B comprises channel segment 51B, . . . , and the chip channel 61L comprises channel segment 51L. Although FIG. 2B shows one channel segment in each of chip channels 61A, 61B, . . . , 61L, each chip channel generally comprises one or more channel segments. For each chip channel having at least two channel segments, the channel segments in each pair of adjacent channel segments form a non-zero angle at the location where the two channel segments are joined.

Each chip channel of the chip channels 61A, 61B, . . . , 61L of FIG. 2B may have a larger flow area than each interposer channel of the interposer channels 71A, 71B, . . . , 71L of FIG. 2A.

The interposer channels 71A, 71B, . . . , 71L of FIG. 2A may be coupled to the chip channels 61A, 61B, . . . , 61L of FIG. 2B to form continuous loops. Each such loop independently consists of a subset of the interposer channels 71A, 71B, . . . , 71L of FIG. 2A and a subset of the chip channels 61A, 61B, . . . , 61L of FIG. 2B, as will be described infra in conjunction with FIGS. 3A, 3B, and 4.

Figure 3B:
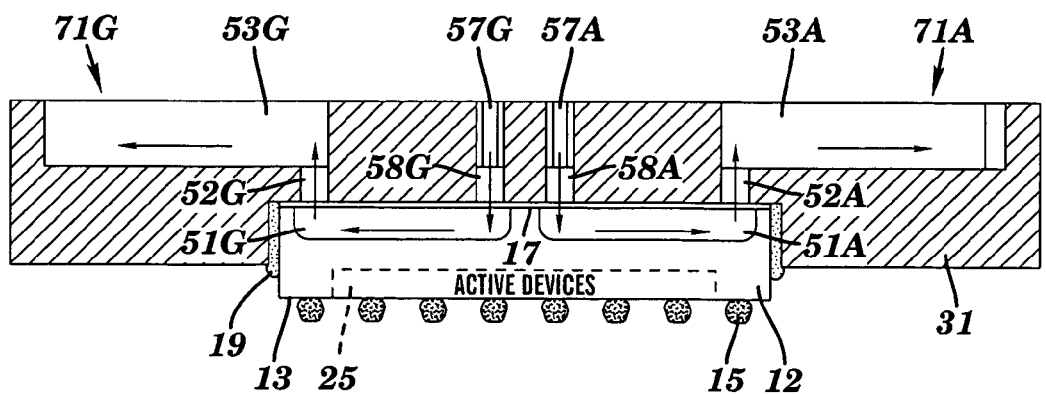
FIG. 3B is a cross-sectional view of the interposer and the semiconductor chip coupled thereto in the cut plane defined in FIG. 3A.

FIG. 3A is a top view of the interposer of FIG. 2A showing a cut plane 3B-3B that defines a cross sectional view of the interposer 31 and the semiconductor chip 12 coupled thereto. FIG. 3B is a cross-sectional view of the interposer 31 and the semiconductor chip 12 coupled thereto in the cut plane 3B-3B defined in FIG. 3A. FIG. 3B comprises the semiconductor chip 12 and the interposer 31 shown in FIG. 1.

The semiconductor chip 12 comprises 12 chip channels, namely channels 61A, 61B, 61L (see FIG. 2B). The interposer 31 comprises 12 interposer channels, namely channels 71A, 71B, . . . , 71L (see FIG. 2A or 3A). A variety of patterns of continuous loops may be formed from the 12 chip channels and the 12 interposer channels. The continuous loops may be closed (i.e., end-to-end connected; also called "closed loop") or open ended. An open ended loop end-to-end connected; also called "closed loop")

In an embodiment of the present invention, 12 continuous loops are formed from the 12 chip channels and the 12 interposer channels. A first loop, which comprises chip channel 61A and interposer channel 71A, includes the following sequence of channel segments: 51A, 52A, 53A, 54A, 55A, 56A, 57A, and 58A; a second loop, which comprises chip channel 61B and interposer channel 71B, includes the following sequence of channel segments: 51B, 52B, 53B, 54B, 55B, 56B, 57B, and 58B; . . . , a twelfth loop, which comprises chip channel 61L and interposer channel 71L, includes the following sequence of channel segments: 51L, 52L, 53L, 54L, 55L, 56L, 57L, and 58L. Each such loop is called a "pulsating heat pipe".

Each loop may be hermetically sealed with a vacuum therein and partially filled with fluid such that 20% to 80%, or alternatively 30% to 70%, of the flow area of the loop contains fluid. The fluid is adapted to transfer heat generated by the heat source(s) in the semiconductor chip 12 to the interposer 31. The first loop will next be described in detail to illustrate a heat transfer mechanism for cooling the semiconductor 12.

Referring to FIGS. 3A and 3B for the first loop, heat generated from the heat sources (e.g., active electronic devices in the region 25 of the semiconductor chip 12) is conducted through the semiconductor material (e.g., silicon) of the semiconductor chip 12 and is transferred to the working fluid in the channel segment 51A. The fluid in the channel segment 51A will be heated and vapor bubbles in the fluid will be created when the fluid reaches its boiling temperature. The vapor pressure inside the bubbles will push the liquids of the fluid towards channel segment 53A through the channel segment 52A. The liquid/vapor fluid components will continue through the channel segment 54A. Once the liquid/vapor pairs reach channel segments 54A, 55A, 56A, and 57A, heat will be extracted from the liquid/vapor fluid components of the by the interposer 31 via condensation from the vapor phase to the liquid phase and the heat released by the condensation is transferred via the cover 41 to the heat sink 24 (see FIG. 1) which is mounted with good thermal contact with the cover 41. In addition, some heat will be transferred from the liquid phase of the fluid to the cover 41 by convection (due to the fluid flow) and subsequent conduction into the material of the cover 41. Because of the heat removal from the heat sink 24 to the ambient environment (e.g., atmospheric air), the temperature of the fluids will be reduced below the boiling temperature such that the vapor bubbles will be substantially or essentially disappear at channel segment 57A. The fluids will pass through channel segment 58L and re-enter channel segment 51A again. The preceding cycle will be repeated. Each of the remaining 11 loops will function similarly, so as to provide an efficient heat spreading and removal from the semiconductor chip 12 to the heat sink 24.

In summary, the preceding mechanism of heat transfer comprises: conductive heat transfer from the heat sources to the fluid in channel segment 51A through the semiconductor material of the semiconductor chip 12; latent heat transfer via vaporization in channel segment 51A; convective heat transfer via fluid flow through channel segments 52A, 53A, 54A, 55A, 56A, 57A; latent heat transfer to the cover 41 via condensation in channel segment 51A; conductive heat transfer from the cover 41 to the heat sink 24; and convective/radiative heat transfer from the heat sink 24 to the ambient environment (e.g., atmospheric air) surrounding the heat sink 24.

The preceding description of fluid flow and heat transfer in the first loop assumed that the first loop is a closed loop. If the first loop is an open ended loop, the fluid will be removed from the loop after each cycle and new fluid will be injected into the loop during the next cycle. For example, the channel segments 58L and 51A (see FIG. 3B) may be decoupled such that the fluid is removed from the loop after passing through channel segment 58L and new fluid is continuously injected into the channel segment 51A so that new fluid will flow through the loop in each cycle. Generally, each loop of the 12 loops may independently be closed or open ended.

Figure 4A:
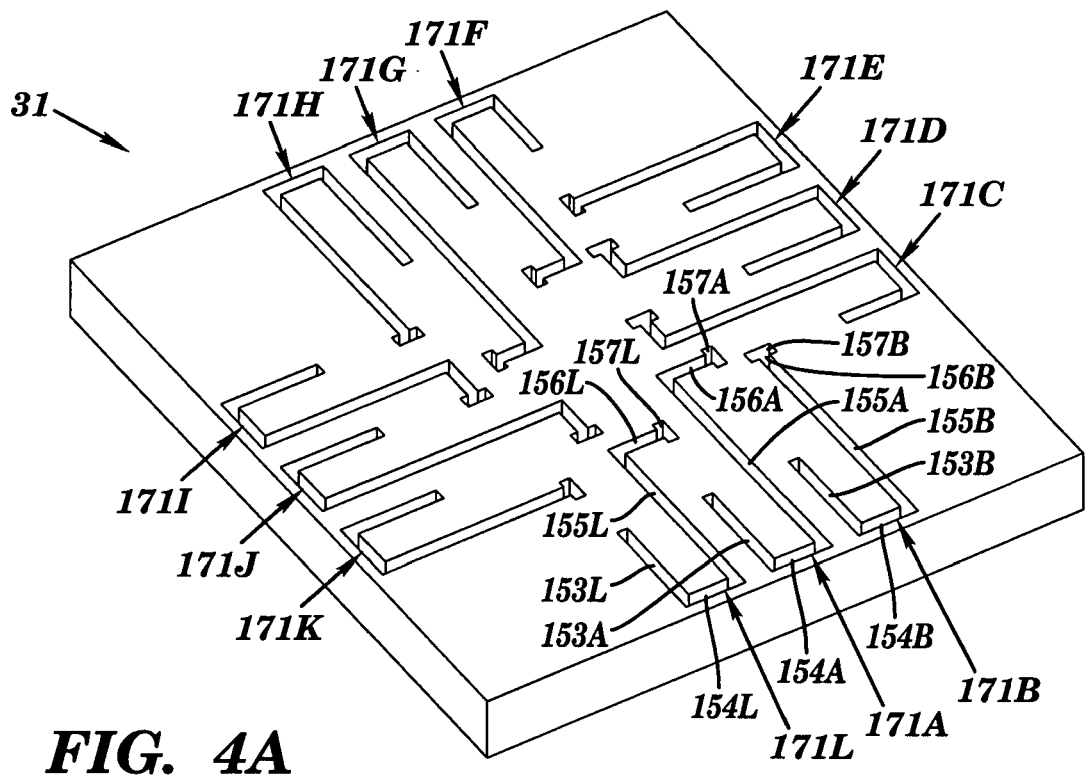
FIGS. 4A and 4B depict a top view of an interposer and semiconductor chip representing a variation of FIGS. 2A and 2B, respectively.
Figure 4B:
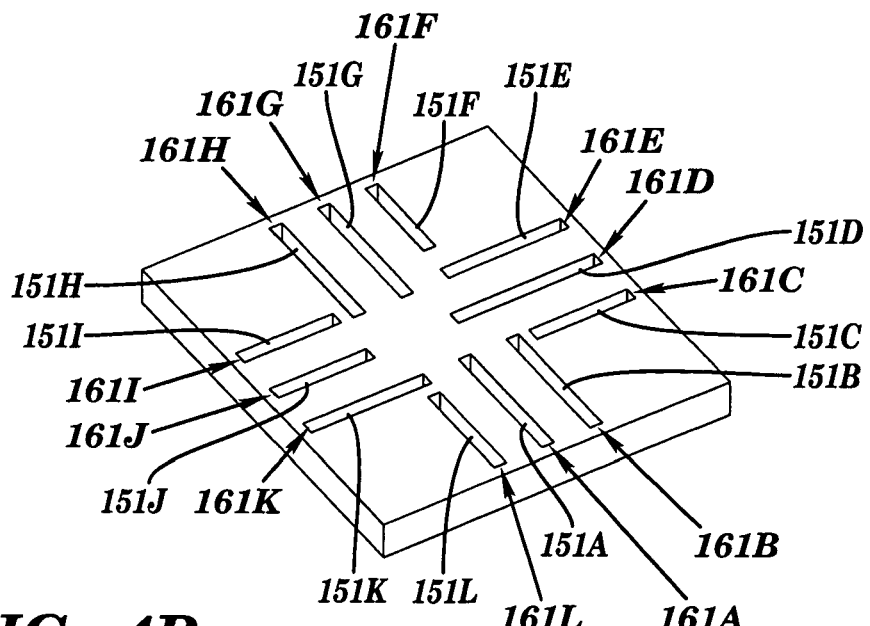

FIGS. 4A and 4B depict a top view of an interposer 131 and semiconductor chip 112 representing a variation of FIGS. 2A and 2B, respectively. The interposer 131 and semiconductor chip 112 are respectively analogous to the interposer 31 and semiconductor chip 12 of FIGS. 1, 2A, 2B, 3A, and 3B. Thus, the interposer 131 and semiconductor chip 112 respectively replace the interposer 31 and semiconductor chip 12 in FIG. 1. The 12 continuous interposer channels 171A, 171B, ..., 171L of FIG. 4A are respectively analogous to the 12 continuous interposer channels 71A, 71B, ..., 71L of FIG. 2A. The 12 continuous chip channels 161A, 161B, ... 161L of FIG. 4B are respectively analogous to the 12 continuous chip channels 61A, 61B, ..., 61L of FIG. 2B. The channel segments 151A and 153A-157A of FIGS. 4A and 4B are respectively analogous to the channel segments 51A and 53A-57A of FIGS. 2A and 2B. The channel segments 151B and 153B-157B of FIGS. 4A and 4B are respectively analogous to the channel segments 51B and 53B-57B of FIGS. 2A and 2B The channel segments 151L and 153L-157L of FIGS. 4A and 4B are respectively analogous to the channel segments 51L and 53L-57L of FIGS. 2A and 2B.

In the embodiment depicted in FIGS. 4A and 4B, only one pulsating heat pipe (i.e., loop) is formed from the 12 chip channels and the 12 interposer channels, with multiple heating and cooling channel segments along the loop. Similar to FIGS. 2A, 2B, 3A, and 3B, the fluid in channel segment 151A in the semiconductor chip 12 is heated and liquid/vapor fluid components are formed when the fluid reaches the boiling temperature. The expanding vapor bubbles will push the liquid/vapor fluid components to channel segments sections 152A, 153A, 154A, 155A, 156A, and 157A. The cooled liquid in this embodiment will flow, however, to section 151B instead of to section 151A in the next cycle. This arrangement will allow the fluid to travel all around the semiconductor chip 112 in one loop with multiple heating channel segments, from channel segment 151A to channel segment 151I. This one continuous loop may be either closed (i.e., in closed a manner that is analogous to the manner in which the first loop may be open ended, as described infra in conjunction with FIGS. 3A and 3B) or open ended.

The embodiment described supra in conjunction with FIGS. 2A, 2B, 3A, and 3B coupled each chip channel of the 12 chip channels to a corresponding interposer channel of the 12 interposer channels to form 12 continuous loops from the 12 chip channels and the 12 interposer channels. The embodiment described supra in conjunction with FIGS. 4A and 4B coupled the 12 chip channels to the 12 interposer channels to form one continuous loop from the 12 chip channels and the 12 interposer channels. Generally, M loops could be formed from the 12 chip channels and the 12 interposer channels, wherein $1 \leq M \leq 12$. As a first example, 6 chip channels could be combined with a corresponding 6 interposer channels to form a first continuous loop, and the remaining 6 chip channels could be combined with the remaining 6 interposer channels to form a second continuous loop, so that M=2. As a second example, 6 chip channels could be combined with a corresponding 6 interposer channels to form a first continuous loop, and each chip channel of the remaining 6 chip channels could be combined with the corresponding remaining interposer channel of the remaining 6 interposer channels to form 6 additional continuous loops, so that M=7. As a third example, 5 chip channels could be combined with a corresponding 5 interposer channels to form a first continuous loop, 3 remaining chip channels could be combined with a corresponding remaining 3 interposer channels to form a second continuous loop, and each chip channel of the remaining 4 chip channels could be individually combined with the 4 corresponding remaining interposer channel of the remaining 4 interposer channels to form a 4 additional continuous loops, so that M=6. The scope of the present invention includes all possible combinations of chip channels and interposer channels to form any possible combination of M continuous loops wherein $1 \leq M \leq 12$.

While the preceding embodiments comprised cooling a semiconductor chip having a heat source therein, the scope of the present invention includes cooling a substrate having a heat source therein, wherein the substrate may comprise, inter alia, a semiconductor chip. While the preceding embodiments utilized 12 continuous chip channels and 12 continuous interposer channels, the scope of the present invention generally includes: a substrate having N continuous substrate channels on a first side of the substrate and having a heat source therein; and an interposer having N continuous interposer channels, wherein $N \geq 2$. The N interposer channels are coupled to the N substrate channels so as to form M continuous loops such that $1 \leq M \leq N$. Each loop of the M loops independently consists of K substrate channels of the N substrate channels and K interposer channels of the N interposer channels in an alternating sequence of substrate channels and interposer channels. For each loop of the M loops, $K \geq 1$ and K is subject to an upper limit consistent with a constraint of having the M loops collectively consist of the N interposer channels and the N substrate channels. Each loop of the M loops is independently open ended or closed. The first side of the substrate is connected to the interposer. The interposer is adapted to be thermally coupled to a heat sink such that the interposer is interposed between the substrate and the heat sink.

The scope of the present invention includes all possible combinations of chip channels and interposer channels to form any possible combination of M continuous loops, wherein $1 \leq M \leq N$, and wherein K may be constant or loop dependent. As a first example, the case of M=N corresponds to the embodiment described supra in conjunction with FIGS. 2A, 2B, 3A, and 3B, wherein each chip channel of the N chip channels is coupled to a corresponding interposer channel of the N interposer channels to form N continuous loops from the N chip channels and the N interposer channels, wherein K=1 for each loop. As a second example, the case of M=1 corresponds to the embodiment described supra in conjunction with FIGS. 4A and 4B, wherein the N chip channels are coupled to the N interposers to form one continuous loop from the N chip channels and the N interposer channels, wherein K=N in the one continuous loop. For other cases, 1<M<N. A special cases of 1<M<N includes having K>1 in each loop of the M loops, wherein the M loops may each have a same value of K or different values of K.

Figure 5:
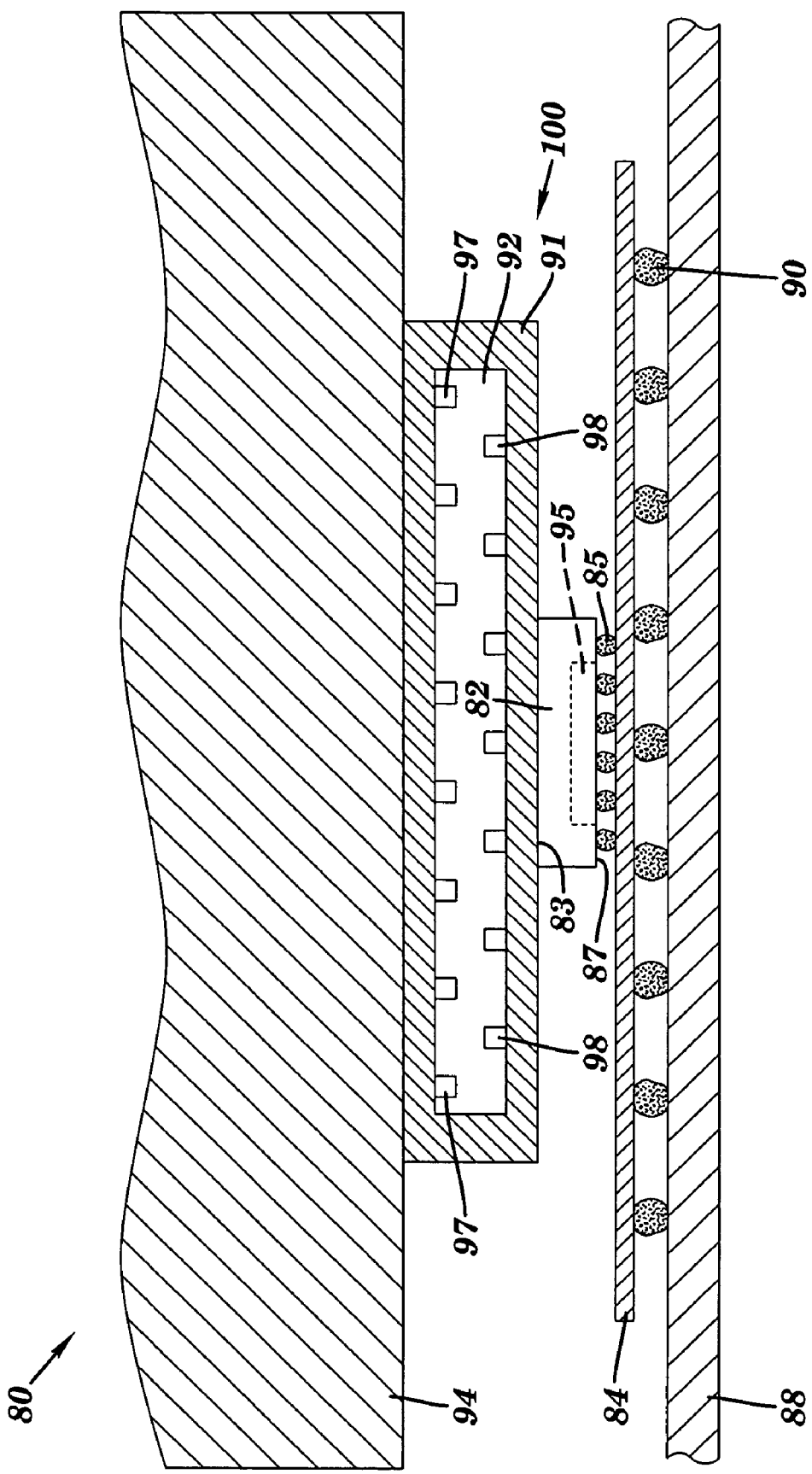
FIG. 5 depicts a front cross-sectional view of a structure comprising a semiconductor chip and an interposer coupled to the semiconductor chip, in accordance with second embodiments of the present invention.

FIG. 5 depicts a front cross-sectional view of a structure 80 comprising a semiconductor chip 82 and a interposer 100 coupled to the semiconductor chip 82, in accordance with second embodiments of the present invention. The semiconductor chip 82 comprises a semiconductor material (e.g., silicon, germanium, etc.). The semiconductor chip 82 may be underfilled with a polymer (not shown) for improved reliability.

Figure 13A:
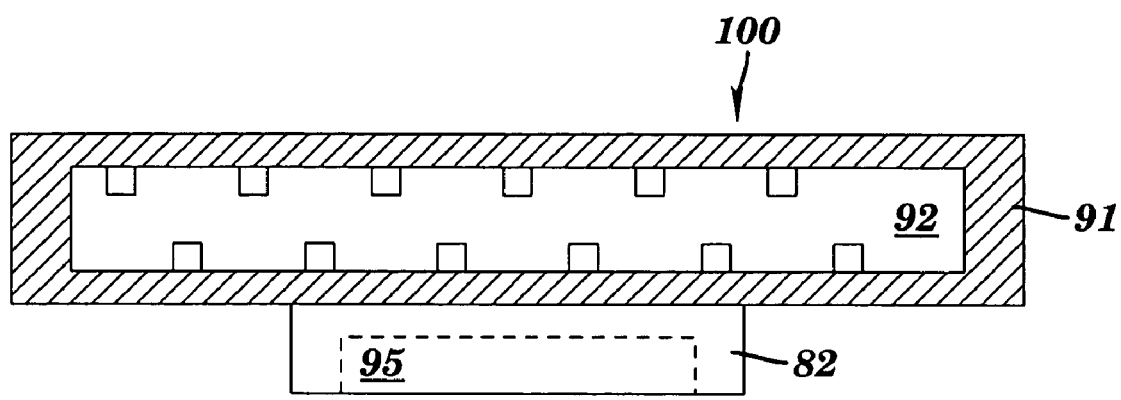
FIG. 13A depicts the semiconductor chip of FIG. 5 abutting against the interposer.
Figure 13B:
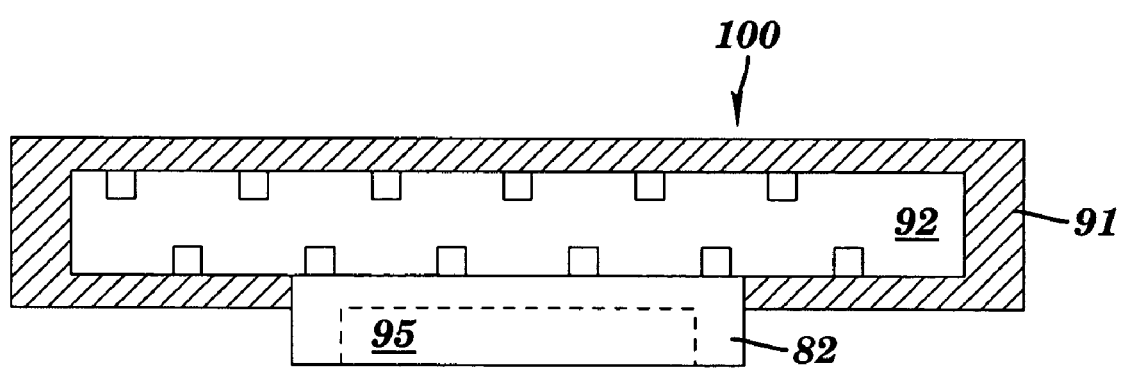
FIG. 13B depicts the semiconductor chip of FIG. 5 placed in a recess within the interposer.

The semiconductor chip 82 may abut against the interposer 100 as shown in FIG. 5, but may alternatively be placed in a recess in the interposer 100. FIG. 13A depicts the semiconductor chip 82 of abutting against the interposer 100. FIG. 13B depicts the semiconductor chip 82 placed in a recess within the interposer 100, wherein a sealant (not shown) may be placed around the semiconductor chip 82 (similar to the sealant 19 of FIG. 1) for mechanically and thermally coupling the semiconductor chip 82 to the interposer 100.

In FIG. 5, the semiconductor chip 82 comprises a front surface 83 and an opposing back surface 87. Active electronic devices (e.g., transistors) within the semiconductor chip 82 generate heat during operation of the semiconductor chip 82. The active electronic devices may be located in a region 95 of the semiconductor chip 82, wherein the region 95 is on the front side of the semiconductor chip 82 bounded by the front surface 83. This generated heat is to be dissipated sufficiently fast so as to maintain the active electronic devices at an acceptable temperature that does not damage the semiconductor chip 82, does not adversely impact electrical performance of the semiconductor chip 82, and does not excessively limit the endurance (e.g., mean time to failure) of the semiconductor chip 82 or of components (e.g., an active electronic device or another device) therein.

The interposer 100 comprises a thermally conductive enclosure 91 which surrounds a cavity 92 of the interposer 100. The cavity 92 contains a thermally conductive foam material (e.g., graphite foam, copper foam, aluminum foam, etc.) having pores therein. The foam material is adapted to be soaked by a liquid filling the pores. A serpentine channel is embedded within the foam material such that the foam material forms a wall around the channel. The serpentine channel comprises a plurality of contiguously connected channel segments. As an example, FIG. 5 depicts upper channel segments 97 and lower channel segments 98. Other configurations of channel segments will be illustrated in FIGS. 6-12 and discussed infra. The channel is adapted to be under a vacuum and partially filled with a fluid (such that 20% to 80%, or alternatively 30% to 70%, of the flow area of the channel contains fluid) that serves to transfer heat from the heat source (e.g., active electronic devices in region 95 of the semiconductor chip 82) to the heat sink 94.

The cavity 92 with foam (e.g., graphite foam) therein is evacuated first through a port, and then filled with working fluid such as water, so that the graphite foam is saturated with the working fluid; however, the channel(s) are only partially filled with the working fluid. The capillary force and surface tension will confine the liquid inside the porous graphite foam and keep the graphite foam soaked with liquid, although there is some material exchange at the boundary of the channels. The liquid-filled graphite foam has a high thermal conductance and can thus conduct heat from a non-channel area to the enclosure 91. In addition, the liquid might evaporate in the foam to form vapor which will escape into the channel, and liquid from the channel will back fill the foam. At same time, the liquid and vapor slug inside the channel transfer heat through sensible and latent heat transfer. The combination of the liquid filled porous media with serpentine channels is characterized by: inter-channel interactions for better heat exchange and spreading; abundant liquid to avoid dry out; and heat transfer by convection, conduction, and phase change.

The operating semiconductor chip 82 is cooled by a heat transfer mechanism in which the heat generated by the semiconductor chip 82 is transferred to the interposer 100 via conduction into the thermally conductive enclosure 91 of the interposer 100. The heat is transferred to the conductive foam and then to the fluid in the channel. The fluid in the channel evaporates to form a liquid/vapor mixture. The liquid/vapor mixture will move along the channel due to thermal gradients along the channel. The vapor condenses at colder locations of the channel due to the heat sink 94. The condensation will occur at a higher rate at channel locations closer to the heat sink 94 than at channel locations further removed from the heat sink 94. Thus, the heat transfer mechanism includes evaporation and condensation inside the channel. The degree of spatial uniformity of the condensation depends on the spatial distribution of heat sink relative to the channel. A secondary heat transfer mechanism comprises conduction from liquid in the channel to the foam material at the foam walls and consequent heat conduction through the foam material to the heat sink 94 via the enclosure 91. Heat is transferred from the heat sink 94 to the surrounding ambient environment (e.g., atmospheric air). The heat sink may be any type of heat sink known to a person of ordinary skill in the art having any geometry (e.g., fins) that is suitable for transferring heat to the surrounding ambient environment.

A coefficient of thermal expansion (CTE) of the enclosure 91 may be substantially equal to a CTE of the semiconductor chip 82. The CTE of the enclosure 91 is substantially equal to the CTE of the semiconductor chip 82 if said CTEs are sufficiently matched so as to substantially prevent or mitigate thermal stresses in the semiconductor chip 82 as the semiconductor chip 82 heats up or cools down. Thus, the enclosure 91 comprises a thermally conductive material such as, inter alia, SiC, AlSi, diamond, copper alloys, etc. The preceding thermally conductive materials (i.e., SiC, AlSi, diamond, copper alloys, etc.) may have a CTE that is substantially equal to a CTE of a semiconductor chip 82 that comprises silicon.

The front surface 83 of the semiconductor chip 82 is electrically connected to a chip carrier 84 using micro solder balls 85 (e.g., Controlled Collapse Chip Connection solder balls). The chip carrier 84 may be an organic chip carrier, a ceramic chip carrier, a silicon chip carrier, etc. The packaged chip comprising the chip carrier 84, the semiconductor chip 82, the interposer 100, and the heat sink 94 is mounted onto an electronic carrier 88 (e.g., a circuit board) using larger solder balls 90 (e.g., a Ball Grid Array solder balls).

FIGS. 6-12 depict illustrative embodiments of serpentine channels within the interposer of FIG. 5.

Figure 6:
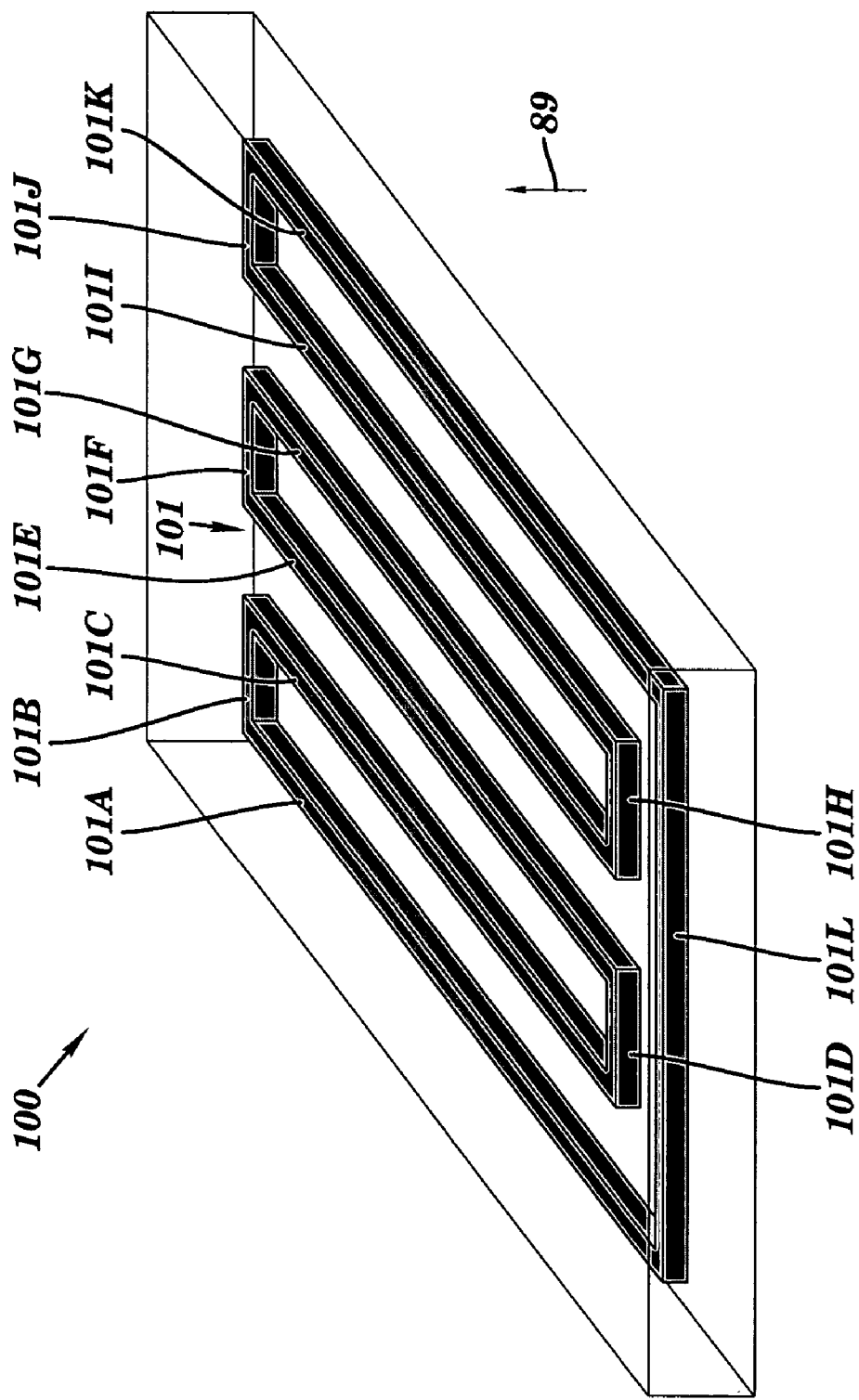

FIG. 6 is a perspective view illustrating a portion of the interposer 100 of FIG. 1 with the serpentine channel 101 inside the foam material within the cavity 92. The enclosure 91 (see FIG. 5) is not shown in FIG. 6). The channel 101 comprises 12 channel segments (i.e., 101A, 101B, ..., 101L). The channel 101 is disposed at a planar level above a bottom surface of the enclosure. The planar level is perpendicular to a thickness direction 89 of the interposer 100. Thus all channel segments are disposed at the same planar level within the interposer 100. A channel width W may be in a range of about 0.5 mm to about 3.0 mm. The channel 101 forms a closed loop, but may alternatively be open ended (see, e.g., FIG. 10 and accompanying description infra).

FIG. 7A is a perspective view illustrating the interposer 100 of FIG. 1 with the serpentine channel 102 inside the foam material within the cavity 92. FIG. 7B is a cross-sectional view of the interposer 100 of FIG. 1 along the cut plane 7B-7B identified in FIG. 7A. FIGS. 7A and 7B are collectively denoted as "FIG. 7". The enclosure 91 (see FIG. 5) is not shown in FIG. 7. The channel 102 comprises a first set of channel segments (102A, 102B, ... 102K) disposed at a first planar level 202A and a second set of channel segments (102M, 102N, ... 102W) disposed at a second planar level 202B. In FIG. 7A, the first set of channel segments at the first planar level 202A and the second set of channel segments at a second planar level 202B are mutually parallel. The first planar level 202A and the second planar level 202B are displaced from each other by a distance D1 and are parallel to each other. Thus, the first planar level 202A and the second planar level 202B are not coplanar. The first planar level 202A and the second planar level 202B are each perpendicular to a thickness direction 89 of the interposer 100. The channel segments of the first planar level 202A are mutually aligned, with respect to the thickness direction 89, to corresponding channel segments of the second planar level 202B. The channel 102 forms a closed loop, but may alternatively be open ended (see, e.g., FIG. 10 and accompanying description infra).

Figure 8A:
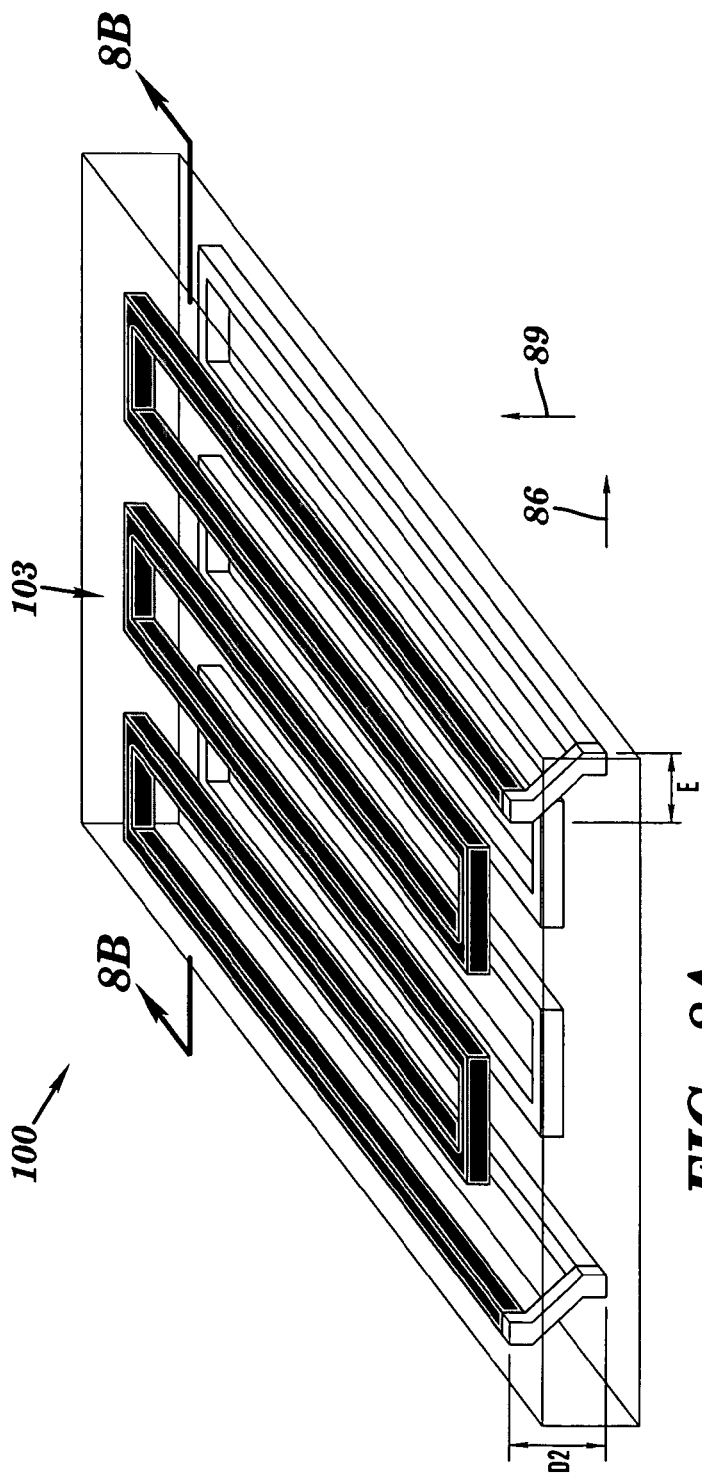
Figure 8B:
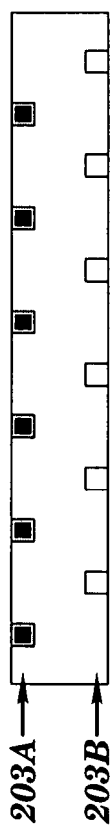

FIG. 8A is a perspective view illustrating the interposer 100 of FIG. 1 with the serpentine channel 103 inside the foam material within the cavity 92. FIG. 8B is a cross-sectional view of the interposer 100 of FIG. 1 along the cut plane 8B-8B identified in FIG. 8A. FIGS. 8A and 8B are collectively denoted as "FIG. 8". The enclosure 91 (see FIG. 5) is not shown in FIG. 8. The channel 103 comprises a first set of channel segments disposed at a first planar level 203A and a second set of channel segments disposed at a second planar level 203B. In FIG. 8A, the first set of channel segments at a first planar level 203A and the second set of channel segments at a second planar level 203B are mutually parallel. The first planar level 203A and the second planar level 203B are displaced from each other by a distance D2 and are parallel to each other. Thus, the first planar level 203A and the second planar level 203B are not coplanar. The first planar level 203A and the second planar level 203B are each perpendicular to a thickness direction 89 of the interposer 100. The channel segments of the first planar level 203A are mutually offset, with respect to the thickness direction 89, by a distance E in a direction that is perpendicular to the thickness direction 89 (i.e., in the direction 86. The channel 103 forms a closed loop, but may alternatively be open ended (see, e.g., FIG. 10 and accompanying description infra).

Figure 9A:
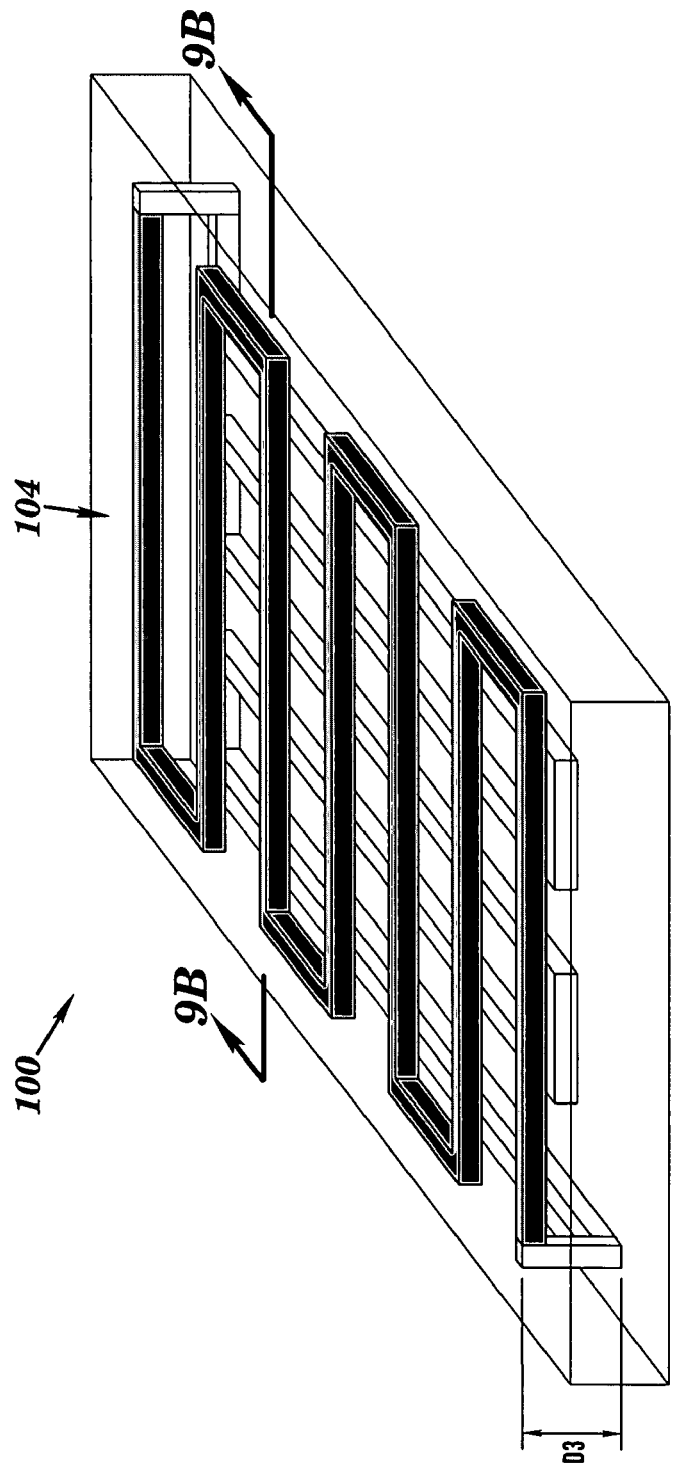
Figure 9B:
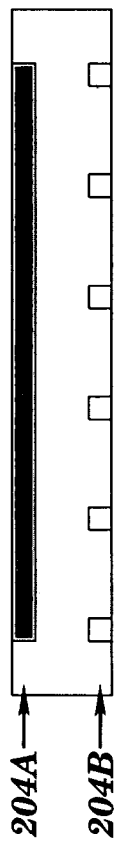

FIG. 9A is a perspective view illustrating the interposer 100 of FIG. 1 with the serpentine channel 104 inside the foam material within the cavity 92. FIG. 9B is a cross-sectional view of the interposer 100 of FIG. 1 along the cut plane 9B-9B identified in FIG. 9A. FIGS. 9A and 9B are collectively denoted as "FIG. 9". The enclosure 91 (see FIG. 5) is not shown in FIG. 9. The channel 104 comprises a first set of channel segments disposed at a first planar level 204A and a second set of channel segments disposed at a second planar level 204B. The first planar level 204A and the second planar level 204B are displaced from each other by a distance D3 and are parallel to each other. The first planar level 204A and the second planar level 204B are each perpendicular to a thickness direction 89 of the interposer 100. The channel segments of the first planar level 204A are perpendicular to the channel segments of the second planar level 204B. The channel 104 forms a closed loop, but may alternatively be open ended (see, e.g., FIG. 10 and accompanying description infra).

FIG. 10A depicts a serpentine channel 105 at planar level 205A of the interposer 100 of FIG. 1 with the channel 105 being inside the foam material within the cavity 92. FIG. 10B is a cross-sectional view of the interposer 100 of FIG. 1 along the cut plane 10B-10B identified in FIG. 10A. FIGS. 10A and 10B are collectively denoted as "FIG. 10". The channel 105 is an open ended loop with end surface 105A bounded by the enclosure 91 and in direct mechanical and thermal contact with the enclosure 91, which provides a cap to the end surface 105A of the channel 105. The end surface 105B of the channel 105 is open ended but bounded by the foam material which effectively caps the end surface 105B. Although there is no unidirectional flow in the channel 105, heat transfer from the fluid in the loop is effectuated by latent heat transfer from vaporization and condensation of the fluid in the channel. Alternatively, both end surfaces 105A and 105B of the channel 105 may be in direct mechanical and thermal contact with the enclosure 91. Alternatively, both end surfaces 105A and 105B of the channel 105 maybe in direct mechanical and thermal contact with the foam material.

FIG. 11A depicts a serpentine channel 106 at planar level 206A of the interposer 100 of FIG. 1 with the channel 106 being inside the foam material within the cavity 92. FIG. 11B is a cross-sectional view of the interposer 100 of FIG. 1 along the cut plane 11B-11B identified in FIG. 11A. FIGS. 11A and 11B are collectively denoted as "FIG. 11". The channel 106 is an closed loop with channel segments 106A, 106B, 106C, 106D, and 106E in direct mechanical and thermal contact with the enclosure 91 to improve heat transfer from the channel 106 to the enclosure 91. Generally, any number of channel segments may be in direct mechanical and thermal contact with the enclosure 91 at one or more planar levels.

Figures 12A, 12B:
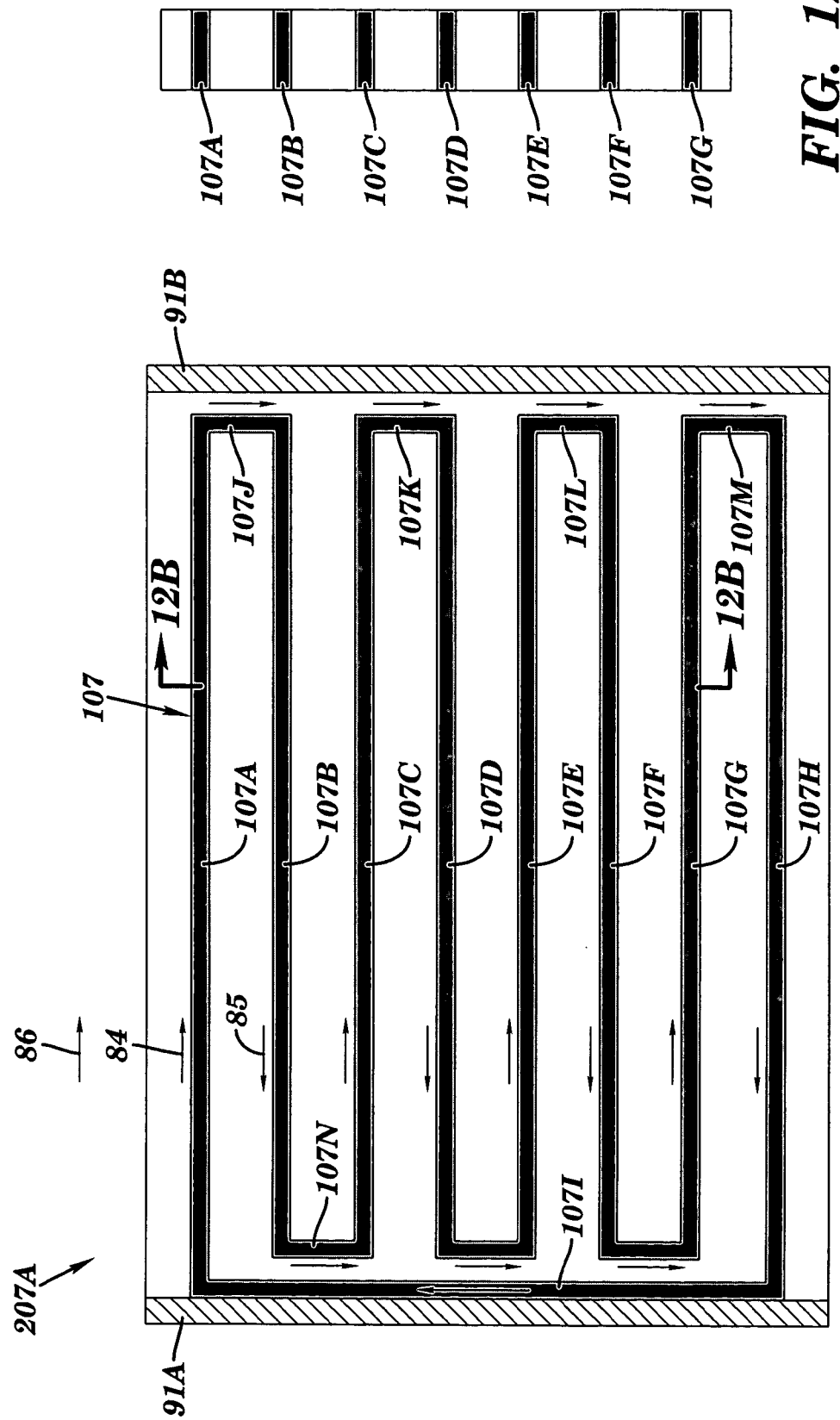

FIG. 12A depicts a closed-loop serpentine channel 107 at planar level 207A of the interposer 100 of FIG. 1 with the channel 107 being inside the foam material within the cavity 92. FIG. 12B is a cross-sectional view of the interposer 100 of FIG. 1 along the cut plane 12B-12B identified in FIG. 12A. FIGS. 12A and 112B are collectively denoted as "FIG. 12". FIG. 12A shows walls 91A and 91B of the enclosure 91, wherein the wall 91A is attached to the heat sink 94, and wherein the wall 91B is attached to the semiconductor chip 92 (see FIG. 5). Thus, the wall 91A is relatively "cold" and the wall 91B is relatively "hot". Channel segment 107I of channel 107 is in direct mechanical and thermal contact with the cold wall 207A, whereas channel segments 107J, 107K, 107L, and 107M of channel 107 are in the vicinity of the hot wall 207B and may alternatively be in direct mechanical and thermal contact with the hot wall 207B. Alternatively, the channel segment 107I of channel 107 may be in the vicinity of the cold wall 207A without being in direct mechanical and thermal contact with the cold wall 207A Channel segments 107A, 107C, 107E, and 107G of the channel 107 have constant cross sectional flow area, whereas channel segments 107B, 107D, 107F, and 107H of the channel 107 are tapered such that the cross-sectional area decreases in a direction 86. The dominant fluid phase in channel segment 107A is liquid which moves in the direction 84 due to capillary action. The fluid is heated in channel segment 107J so that vapor becomes the dominant fluid component in channel segment 107B. The vapor phase in channel segment 107B moves preferentially in the direction 85 from smaller to larger cross-sectional flow area. In channel segment 107N, the fluid is cooled with consequent condensation, so that the liquid phase is the dominant component in channel segment 107C. In a similar fashion, the fluid moves through the remaining channel segments unidirectionally as indicated by the arrows which depict the flow direction in each channel segment. Thus the heating at the wall 91B and the cooling at the wall 91A effectuates the unidirectional flow.

While FIGS. 6-12 each depict one channel within the interposer 100, the scope of the present invention generally includes at least one channel within the interposer 100. For example, a plurality of channels may be included within the interposer 100. Each channel of the at least one channel within the interposer 100 may independently form a closed loop or an open ended loop While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method of cooling a substrate, comprising:

providing a substrate comprising N continuous substrate channels on a first side of the substrate, said substrate having a heat source therein, said N being at least 2;

providing an interposer comprising N continuous interposer channels, said N interposer channels being coupled to the N substrate channels so as to form M continuous loops such that $1 \leq M \leq N$, each loop of the M loops independently consisting of K substrate channels of the N substrate channels and K interposer channels of the N interposer channels in an alternating sequence of substrate channels and interposer channels, for each loop of the M loops said K is at least 1 and is subject to an upper limit consistent with a constraint of having the M loops collectively consist of the N interposer channels and the N substrate channels, each loop of the M loops independently being open ended or closed, said first side of the substrate being connected to the interposer, said interposer being thermally coupled to a heat sink such that the interposer is interposed between the substrate and the heat sink;

generating heat by the heat source; and circulating fluid in the N interposer channels and the N substrate channels, wherein a portion of the heat generated by the heat source is transferred to the fluid in the N substrate channels, and wherein a percentage of the portion of the heat is transferred from the fluid in the N interposer channels to the heat sink.

2. The method of claim 1, wherein said M=N.

3. The method of claim 1, wherein said M=1 such that the M continuous loops consist of one continuous loop.

4. The method of claim 3, wherein the one continuous loop is open ended.

5. The method of claim 1, wherein 1<M<N.

6. The method of claim 5, wherein K>1 in each loop of the M loops.

7. The method of claim 5, wherein K=1 in at least one loop of the M loops.

8. The method of claim 1, wherein a first loop of the M loops comprises a first interposer channel of the N interposer channels, wherein the first interposer channel comprises a first channel segment and a second channel segment, and wherein the first channel segment is about perpendicular to the second channel segment.

9. The method of claim 1, wherein each substrate channel of the N substrate channels has a larger flow area than each interposer channel of the N interposer channels.

10. The method of claim 1, wherein the interposer is thermally coupled to the heat sink by a thermally conductive cover that is sandwiched between the heat sink and the interposer.

11. The method of claim 1, wherein a coefficient of thermal expansion (CTE) of the interposer is substantially equal to a CTE of the substrate.

12. The method of claim 1, wherein the N substrate channels and the N interposer channels are hermetically sealed with a vacuum therein.

13. The method of claim 12, wherein a fluid partially but not totally fills each substrate channel of the N substrate channels and each interposer channel of the N interposer channels, and wherein the fluid is adapted to transfer heat from the heat source to the interposer.

14. The method of claim 1, wherein the substrate comprises a semiconductor chip, wherein the semiconductor chip comprises active electronic devices on a second side of the substrate that is opposite the first side of the substrate, and wherein the heat source comprises the active electronic devices.

15. The method of claim 1, wherein the portion of the heat transferred from the heat source to the fluid is by a heat transfer mechanism that includes a phase change from a liquid phase of the fluid to a vapor phase of the fluid, and wherein the percentage of the portion of the heat transferred from the fluid to the heat sink is by a heat transfer mechanism that includes a phase change from the vapor phase of the fluid to the liquid phase of the fluid.

16. A method of cooling a structure, comprising:

providing a heat source, a heat sink, and an interposer, said the interposer being interposed between the heat sink and the heat source, said interposer comprising an enclosure that encloses a cavity, said enclosure being made of a thermally conductive material, said cavity comprising a thermally conductive foam material therein, said foam material comprising pores and comprising at least one serpentine channel, each serpentine channel having a plurality of contiguously connected channel segments, each serpentine channel independently forming a closed loop or an open ended loop, said foam being soaked by a liquid filling said pores;

generating heat by the heat source; and providing a fluid in each serpentine channel, wherein a portion of the heat generated by the heat source is transferred to the fluid, and wherein a percentage of the portion of the heat is transferred from the fluid to the heat sink.

17. The structure of claim 16, wherein the substrate comprises a semiconductor chip, wherein a first side of the semiconductor chip is in mechanical and thermal contact with the interposer, wherein the semiconductor chip comprises active electronic devices on a second side of the semiconductor chip that is opposite the first side of the semiconductor chip, and wherein the heat source comprises the active electronic devices.

* * * * *